United States Patent
Suzuki

(10) Patent No.: US 6,437,362 B2
(45) Date of Patent: Aug. 20, 2002

(54) AVALANCHE PHOTODIODE

(75) Inventor: Asamira Suzuki, Tokyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/808,651

(22) Filed: Mar. 16, 2001

(30) Foreign Application Priority Data

Mar. 16, 2000 (JP) ........................................ 2000-073833
Feb. 21, 2001 (JP) ........................................ 2001-044738

(51) Int. Cl.[7] ........................................ H01L 31/0304
(52) U.S. Cl. ........................................ 257/21; 257/198
(58) Field of Search ........................................ 257/21, 186

(56) References Cited

U.S. PATENT DOCUMENTS

| | | |
|---|---|---|
| 4,933,731 A | 6/1990 | Kimura |
| 4,942,436 A | 7/1990 | Vetterling |
| 4,982,255 A | 1/1991 | Tomita |
| 5,075,750 A | 12/1991 | Kagawa |
| 5,187,553 A | 2/1993 | Makita |
| 5,308,995 A | 5/1994 | Tsuji et al. |
| 5,338,947 A | 8/1994 | Watanabe |
| 5,369,292 A | 11/1994 | Yoo et al. |
| 5,432,361 A | 7/1995 | Taguchi |
| 5,471,068 A | 11/1995 | Tsuji et al. |

FOREIGN PATENT DOCUMENTS

| | | |
|---|---|---|
| JP | 2-298082 | 12/1990 |
| JP | 3-66179 | 3/1991 |
| JP | 4-282874 | 10/1992 |

*Primary Examiner*—Jerome Jackson, Jr.
(74) *Attorney, Agent, or Firm*—RatnerPrestia

(57) ABSTRACT

An avalanche photodiode (APD) of the present invention uses a distortion-compensated superlattice multiplication layer (103) for the superlattice multiplication layer. It also uses a multi-layered light-reflecting layer as the light-reflecting layer. This structure of the present invention makes it possible to reduce a layer thickness of the superlattice multiplication layer without decreasing an electron multiplication factor and increasing a dark current. Accordingly, the APD of the present invention shows high response and low operating voltage, while it also maintains low dark current, low noise and broad band at the same time.

5 Claims, 3 Drawing Sheets

FIG. 4A
FIG. 4B
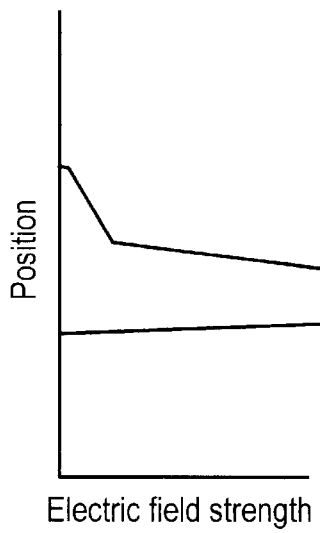
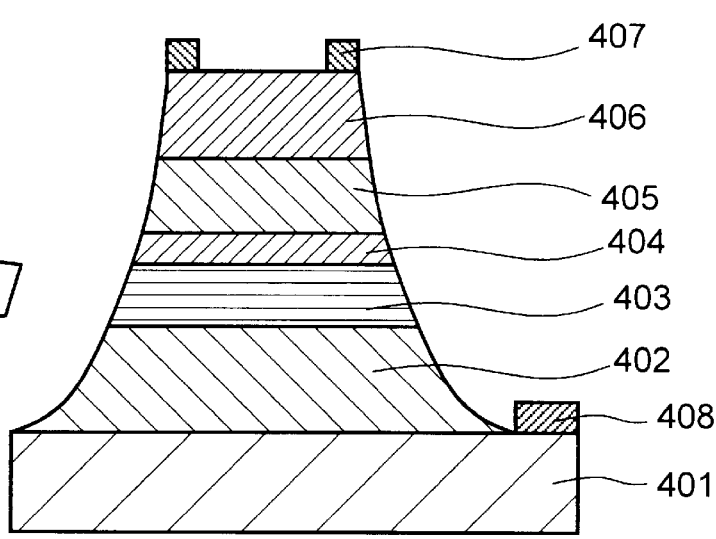
FIG. 5A
PRIOR ART
FIG. 5B
PRIOR ART
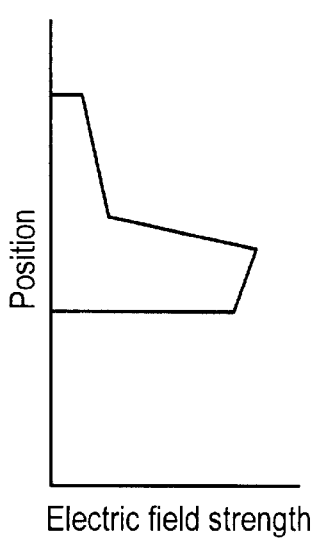
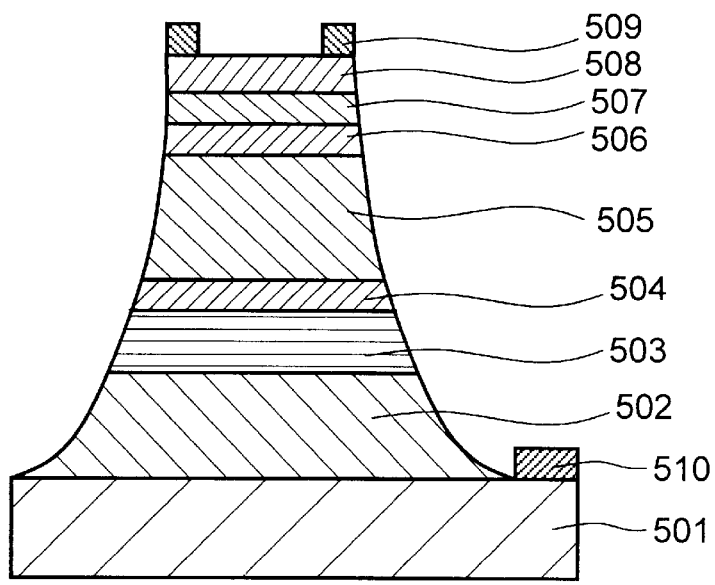

AVALANCHE PHOTODIODE

FIELD OF THE INVENTION

The present invention relates to an avalanche photodiode that realizes high sensitivity, low noise, broad band, and low dark current at the same time.

BACKGROUND OF THE INVENTION

The so-called superlattice avalanche photodiode (to be referred to hereinafter as an APD) that uses a superlattice for the multiplication layer has been used in recent years as an APD for optical communications in a wavelength of 1.3 μm or 1.55 μm. In general, multiplication noise of the APD decreases as a ratio between ionization rates of electrons and holes ($\alpha$ and $\beta$), which is inherent to a semiconductor used for the multiplication layer, departs from value "1". A superlattice structure is used for the multiplication layer in order to increase the ratio of the ionization rates $\alpha/\beta$ or $\beta/\alpha$. It has been known that, an $In_{0.52}Al_{0.48}As/In_{0.8}Ga_{0.2}As_{0.6}P_{0.4}$ layer, which is lattice-matched with an InP substrate, in particular, has a large $\alpha$ value, and is therefore effective for achieving low noise, since it has nearly no discontinuity in the valence band, whereas discontinuity in the conduction band is large in the interface.

In addition, there has been proposed a structure, in which a light-absorbing layer is separated from a superlattice multiplication layer and that the light-absorbing layer is comprised of p-type, so as to differentiate an electric field intensity between the superlattice multiplication layer and the light-absorbing layer in order to control an avalanche breakdown within the light-absorbing layer, and to limit an area wherein avalanche amplification takes place only in the superlattice region. As an example of such a structure that satisfies all of the foregoing conditions, Japanese Patent Laid-open Publication, No. H02-298082, discloses a structure wherein a thin sheet-doping layer having a high concentration of p-type impurities is placed between a p⁻-InGaAs light-absorbing layer and a superlattice multiplication layer.

Further, as described in Japanese Patent Laid-open Publication, No. H02-282847, if a tunnel current is generated in the sheet-doping layer, the tunnel current can be controlled by using an layer having a larger band gap such as $In_{0.52}Al_{0.48}As$ layer, an InP layer, or an $In_{0.8}Ga_{0.2}As_{0.6}P_{0.4}$ layer.

FIGS. 5A and 5B show an example of structure of a superlattice APD element of the prior art. FIG. 5A illustrates electric field intensity distribution when a reverse bias voltage is applied to this element, and FIG. 5B shows a cross sectional view of the element. In FIG. 5B, the superlattice APD element of the prior art comprises:

(a) an n⁺-InP substrate 501;
(b) an n⁺-InP buffer layer 502;
(c) a non-doped $In_{0.52}Al_{0.48}As/In_{0.8}Ga_{0.2}As_{0.6}P_{0.4}$ superlattice multiplication layer 503;
(d) a p-type InP layer (sheet-doping layer) 504 having an impurity concentration of $8 \times 10^{17}$ cm$^{-3}$ and a thickness of 160 Å;
(e) a p⁻-type $In_{0.47}Ga_{0.53}As$ light-absorbing layer 505 having impurity concentration of $2 \times 10^{15}$ cm$^{-3}$ and a thickness of 1 μm;
(f) a p⁺-$In_{0.47}Ga_{0.53}As$ layer 506 having an impurity concentration of $2 \times 10^{17}$ cm$^{-3}$ and a thickness of 500 Å;
(g) a p-type InP window layer 507 having an impurity concentration of $1 \times 10^{18}$ cm$^{-3}$ and a thickness of 1000 Å;
(h) a p⁺-$In_{0.47}Ga_{0.53}As$ contact layer 508 having an impurity concentration of $1 \times 10^{18}$ cm$^{-3}$ and a thickness of 1000 Å;
(i) an AuZnNi electrode and reflector (P-electrode) 509; and
(j) an AuGeNi electrode (N-electrode) 510.

In the foregoing structure, light incident from one side of the n⁺-InP substrate 501 is absorbed in the $In_{0.47}Ga_{0.53}As$ light-absorbing layer 505, and pairs of electrons and holes are generated. The electrons travel toward the superlattice multiplication layer 503 responsive to the bias voltage applied between the AuZnNi electrode 509 and the AuGeNi electrode 510, and are injected into the layer. Because the AuZnNi electrode 509 also serves as a light-reflecting layer, the light incident from the side of n⁺-InP substrate 501 and not absorbed in the light-absorbing layer 505 is reflected by the AuZnNi electrode 509, and is then absorbed almost entirely when it passes again through the light-absorbing layer 505. Since the incident light is effectively used in the described manner, a quantum efficiency does not decrease even if a layer thickness of the light-absorbing layer 505 is a half of 2 μm, which is a reciprocal number of its absorption coefficient. Moreover, a response of the APD increases, because the layer thickness of the light-absorbing layer 505 is reduced.

Furthermore, since the superlattice multiplication layer 503 has a sufficiently large ionization rate of electrons as compared with an ionization rate of holes, it realizes multiplication of the electrons injected into the superlattice multiplication layer 503, by means of a veritable electron injection, without increasing multiplication noises.

However, the above-described structure has problems. Described first is a technical problem inherent in the superlattice APD of the above structure.

As previously described, the electrons generated in the light-absorbing layer are injected into the superlattice multiplication layer by the applied electric field, and they are ionized as they receive energy corresponding to the discontinuity in the conduction band of the superlattice layer. The thinner the layer thickness of the superlattice multiplication layer, the shorter an avalanche progression time becomes, and hence the response increases, because the electrons are moving through each semiconductor layer during this period. However, a reduction in layer thickness of the multiplication layer lowers the multiplication factor, since it decreases probability of the ionization. Moreover, it reduces the $\alpha/\beta$ ratio between the ionization rate $\alpha$ of electrons and the ionization rate $\beta$ of holes, because it tends to retard ionization of the electrons, thereby increasing the excess noises at the same time.

Another improved APD is disclosed in U.S. Pat. No. 5,471,068, where a strain is applied to at least one of well layer and superlattice avalanche multiplier layer to decrease the energy difference between lower end of conduction band of the well layer and the barrier layer, or to increase the energy difference between the upper end of the valence band of them. But, APD using the above strained layer could not sufficiently decrease the energy difference between lower end of conduction band of the well layer and the barrier layer to zero level.

The present invention aims to address the above shortcomings that are inherent to the superlattice APD of the prior art, so as to decrease the dark current, greatly improve high frequency characteristics, and also reduce the operating voltage at the same time by reducing the energy difference between lower end of conduction band of the well layer and the barrier layer to nearly zero.

SUMMARY OF THE INVENTION

The present invention introduces a distortion-compensated superlattice into a superlattice multiplication layer in the superlattice APD, so as to increase discontinuity $\Delta Ec$ in a conduction band while maintaining discontinuity in a valence band to nearly zero. In other words, in the APD of the present invention, discontinuity in a valence band is made nearly zero by introducing InGaAsP layer as a well layer, while strain is introduced to the superlattice multiplication layer to increase $\Delta Ec$. This structure is effective to increase an electron multiplication factor and also effective to decrease pileup of holes. The structure of the present invention increases an ionization rate $\alpha$ of electrons, because it increases the $\Delta Ec$, and hence a ratio $\alpha/\beta$ as well. Accordingly, the multiplication factor increases, and excess noise is reduced. Because an effective band gap $E_{g,eff}$ of the superlattice layer increases, on the other hand, a dark current is reduced. In addition, the present invention provides a reflective multi-layered structure for a light-reflecting layer of the superlattice APD in order to improve utilization efficiency of incident light. This structure of the present invention provides for the possibility of reducing a layer thickness of the superlattice multiplication layer without decreasing a multiplication factor, thereby realizing the superlattice APD of low operating voltage while increasing a response thereof.

BRIEF DESCRIPTION OF THE DRAWINGS

FIG. 4A shows electric field strength in the APD;

FIG. 4B shows a cross sectional view of an APD of a second exemplary embodiment of the present invention;

FIG. 5A shows an electric field strength in an APD of the prior art; and

FIG. 5B shows a cross sectional view of the APD of the prior art.

DESCRIPTION OF THE PREFERRED EMBODIMENTS

First Exemplary Embodiment

With reference to accompanying drawings, a first exemplary embodiment of the present invention will be described.

Figures 1A, 1B:
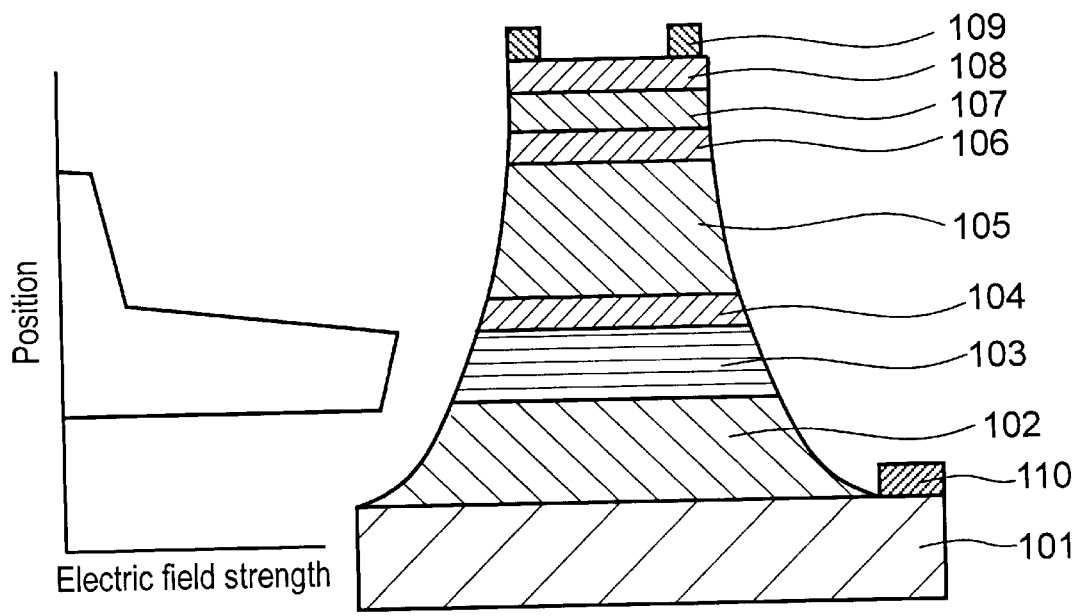
FIG. 1A shows electric field strength in an APD of a first exemplary embodiment of the present invention.
FIG. 1B shows a cross sectional view of the APD of the first exemplary embodiment of the present invention.

FIG. 1B shows a cross sectional view of an APD of this exemplary embodiment, and FIG. 1A shows an electric field strength distribution when a reverse bias voltage is applied to this APD.

In FIG. 1B, the APD of present exemplary embodiment comprises:

(a) an $n^+$-InP substrate 101;

(b) an $n^+$-InP buffer layer 102;

(c) a distortion-compensated superlattice multiplication layer 103 comprising non-doped $In_xAl_{1-x}As/In_yGa_{1-y}As_zP_{1-z}$;

(d) a p-type InP layer (sheet-doping layer) 104 having an impurity concentration of $8\times10^{17}$ cm$^{-3}$ and a thickness of 160 Å;

(e) a $p^-$-type $In_{0.47}Ga_{0.53}As$ light-absorbing layer 105 having an impurity concentration of $2\times10^{15}$ cm$^{-3}$ and a thickness of 1 μm;

(f) a $p^+$-$In_{0.47}Ga_{0.53}As$ layer 106 having an impurity concentration of $2\times10^{17}$ cm$^{-3}$ and a thickness of 500 Å;

(g) a $p^+$-InP window layer 107 having an impurity concentration of $1\times10^{18}$ cm$^{-3}$ and a thickness of 1000 Å;

(h) a $p^+$-$InO_{0.47}Ga_{0.53}As$ contact layer 108 having an impurity concentration of $1\times10^{18}$ cm$^{-3}$ and a thickness of 1000 Å;

(i) an AuZnNi electrode 109; and (j) an AuGeNi electrode 110.

The APD in this invention is characterized by having the distortion-compensated superlattice multiplication layer 103, where x, y, and z respectively satisfy the following conditions:

$0 \leq x < 0.52$;

$0.8 < y \leq 1$; and $0 \leq z < 0.6$.

A method of manufacturing the APD of the present exemplary embodiment is described below.

Individual layers composed of compound semiconductor material and comprising the APD are fabricated by epitaxially growing each layer using a gas-source molecular beam epitaxy (MBE) method, and laminating them consecutively on a pre-etched $n^+$-InP substrate 101. The AuZnNi electrode 109 and the AuGeNi electrode 110 are fabricated by metal vacuum deposition and photo-lithographic process.

FIG. 1A shows an electric field strength distribution within an element having the structure described above, when a positive electric potential, that is the reverse bias voltage, is applied to its n-side. Under a condition where the reverse bias voltage is applied, light incident to the $n^+$-InP substrate 101 is absorbed in the $In_{0.47}Ga_{0.53}As$ light-absorbing layer 105, and pairs of electrons and holes are generated. The generated electrons move toward the superlattice multiplication layer 103 responsive to the bias voltage applied between the AuZnNi electrode 109 and the AuGeNi electrode 110. Since the electric field strength is concentrated in the layer 103, as shown in FIG. 1A, the electrons injected into the layer 103 are accelerated, and thereby electronic multiplication occurs while repeating impact ionization.

The layer 103 represents the distortion-compensated superlattice layer composed of $In_xAl_{1-x}As$ and $In_yGa_{1-y}As_zP_{1-z}$ having a band-gap energy of 1.45 eV or greater. $In_yGa_{1-y}As_zP_{1-z}$ has a lattice constant, of which lattice-mismatch with respect to InP is opposite in direction to that of $In_xAl_{1-x}As$, and discontinuity in a valence band with $In_xAl_{1-x}As$ is nearly zero.

Figure 2:
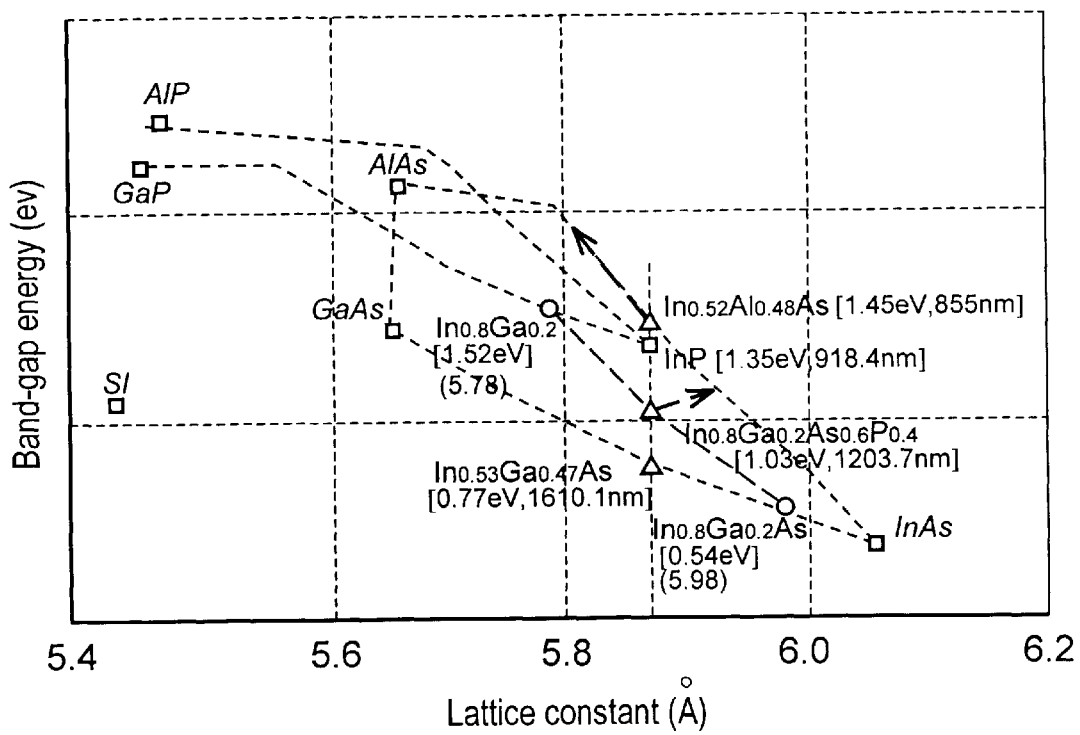
FIG. 2 shows characteristics of materials that compose a superlattice multiplication layer in the first exemplary embodiment of the present invention.
Figure 3:
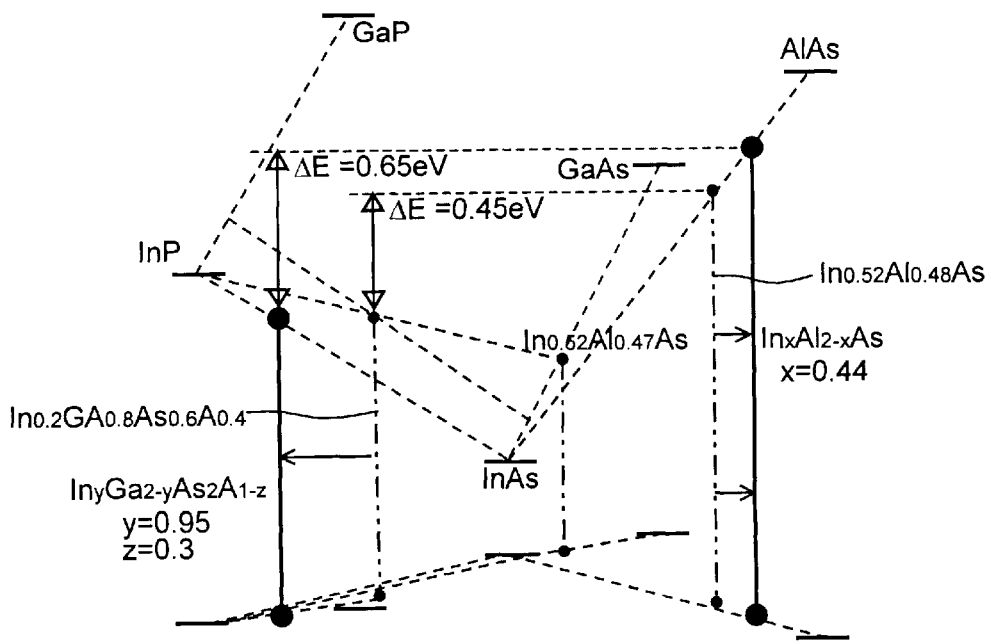
FIG. 3 shows a band diagram of the superlattice multiplication layer in the first exemplary embodiment of the present invention.

FIG. 2 shows relations between lattice constant and band-gap energy of various materials that compose the layer 103 in the APD of this exemplary embodiment. FIG. 3 is a band diagram of the layer 103 in the APD of this exemplary embodiment.

If the x is made smaller than 0.52 in $In_xAl_{1-x}As$, x=0.44, for instance, the lattice constant becomes 5.83 Å, and the band gap becomes 1.75 eV, as shown in FIG. 2. In the case of $In_yGa_{1-y}As_zP_{1-z}$, on the other hand, the lattice constant becomes 5.91 Å, and the band gap becomes 1.1 eV, if y=0.95 and z=0.3. This makes the layer 103 having a large discontinuity in the conduction band as compared to any superlattice layer fabricated by the conventional method, since a difference in discontinuity of the conduction band becomes 0.65 eV while maintaining zero discontinuity in the valence band, as shown in FIG. 3.

Although the superlattice layer of the prior art has an ionization rate of electrons large enough against an ionization rate of holes, the distortion-compensated superlattice multiplication layer introduced by the present invention has an ionization rate of electrons far in excess of the conventional one. In addition, since a band gap of a well layer and a band gap of a barrier layer become larger than those of the conventional superlattice, an effective band gap as the superlattice is increased, and therefore a dark current due to the tunnel current decreases.

In the APD of the present invention, the electric field strength applied to the superlattice multiplication layer is increased as compared with the conventional one, because reverse bias voltage can be increased as the dark current decreases. It is obvious when the electric field strength distribution of the APD of this invention shown in FIG. 1A is compared with FIG. 5A representing an electric field strength distribution of the APD of the prior art.

According to the APD of the present invention, discontinuity in a valence band is made nearly zero by introducing InGaAsP layer as a well layer, while strain is introduced to the superlattice multiplication layer to increase $\Delta Ec$.

Accordingly, a large multiplication factor can be obtained while the dark current is kept suppressed. On the other hand, it is significance to obtain the large multiplication factor while keeping the dark current suppressed, in a sense that it realizes a reduction of a superlattice period of the superlattice multiplication layer, because it is equivalent to a large ionization rate of electrons. As a result, a layer thickness of the superlattice layer can be decreased to shorten a moving time of electrons, and thereby the high frequency response can be obtained.

With the structure as described above, pure electronic multiplication is realized without increasing the multiplication noise in the layer 103, and hence performance of the superlattice APD is enhanced.

In this exemplary embodiment, although $In_yGa_{1-y}As_zP_{1-z}$, is used as a material of the well layer in the superlattice multiplication layer, this material may be substituted by InGaALAs to obtain similar characteristics by controlling the composition of In, Ga Al and As.

Second Exemplary Embodiment

Referring now to the accompanying drawings, a second exemplary embodiment of the present invention will be described.

An APD of this exemplary embodiment is characterized by having a reflective multi-layer structure in order to improve a utilization efficiency of incident light in the first exemplary embodiment. FIG. 4B shows a cross sectional view of the APD of this exemplary embodiment, and FIG. 4A shows an electric field strength distribution when a reverse bias voltage is applied to this APD.

In FIG. 4, the APD of this exemplary embodiment comprises:

(a) an $n^+$-InP substrate 401;
(b) an $n^+$-InP buffer layer 402;
(c) a distortion-compensated superlattice multiplication layer 403 comprising nondoped $In_xAl_{1-x}As/In_yGa_{1-y}As_zP_{1-z}$;
(d) a p-type InP layer (sheet-doping layer) 404 having an impurity concentration of $8\times10^{17}$ cm$^{-3}$ and a thickness of 160 Å;
(e) a $p^-$-type $In_{0.47}Ga_{0.53}As$ light-absorbing layer 405 having an impurity concentration of $3\times10^{15}$ cm$^{-3}$ and a thickness of 0.4 μm;

(f) a $p^+$-type $In_{0.52}A_{0.48}As/In_{0.8}Ga_{0.2}As_{0.6}P_{0.4}$ multi-layered light-reflecting layer 406 having an impurity concentration of $1\times10^{18}$ cm$^{-3}$;
(g) an AuZnNi electrode 407; and
(h) an AuGeNi electrode 408.

In the foregoing structure, values x, y, and z of the distortion-compensated superlattice multiplication layer 403 respectively satisfy the same conditions as those of the first exemplary embodiment.

A method of fabricating the element of this exemplary embodiment is same as what has been described in the first exemplary embodiment.

Of all light incident to the $n^+$-InP substrate 401, a part not absorbed in the light-absorbing layer 405 is reflected by the multi-layered light-reflecting layer 406, and then absorbed in the light-absorbing layer 405 as it again passes therethrough. The multi-layered light-reflecting layer 406 of this embodiment, because it uses a multi-layered structure, can reflect the light efficiently, as it gains a reflectivity of 99% or higher, whereas a reflection surface of a metal electrode used in the prior art can not obtain sufficient reflection of light since it has a reflectivity of only about 50%. As a result, the present element produces a standing wave between a light entrance plane and the multi-layered light-reflecting layer 406, so as to increase an absorption efficiency in the light-absorbing layer 405, and hence a quantum efficiency at the same time. For this reason, the quantum efficiency of the light-absorbing layer 405 does not decrease, even though its layer thickness is one quarter or less of 2 μm, which is a reciprocal number of the absorption coefficient of 1.55 μm wave length light. On the other hand, a response of the APD improves, since the layer thickness of the light-absorbing layer 405 is reduced, which shortens a traveling distance of carriers generated by injection of the light.

Although what has been described above is an example, in which the light-absorbing layer 405 has a layer thickness of 0.5 μm, it has been verified that a light-reflecting film of 60% or greater in reflectivity can be obtained with a light-absorbing layer 405 having a layer thickness of 0.8 μm or less.

In other words, the layer thickness of the light-absorbing layer 405 can be reduced to 80% or less in this exemplary embodiment, though the conventional structure had required the light-absorbing layer to have a layer thickness of one half of a reciprocal number (2 μm) of an absorption coefficient for 1.55 μm wave length light.

The APD of this exemplary embodiment is basically identical in other structural and operational features to those of the first exemplary embodiment, except that it is provided with the reflective multi-layered structure. In addition, the above function can be provided independently with that of the first exemplary embodiment.

A method of fabricating a multi-layered light-reflecting layer of this exemplary embodiment will be described hereinafter.

A method of fabricating the individual layers composed of compound semiconductor materials comprising the APD has been described previously. A multi-layered light-reflecting layer can be formed consecutively by the gas-source MBE after the above APD element is formed. Alternatively, a photolithographic method may be used to form a window, after forming an AuZnNi electrode 109, and the multi-layered light-reflecting layer may be formed on it. A material of the multi-layered light-reflecting layer needs not be limited to the compound semiconductor, and it can be formed by laminating dielectric material or the like by any other known thin-film forming methods such as the sputtering, CVD and the like, when forming it after formation of the AuZnNi electrode 109.

As a result, this exemplary embodiment is not only capable of increasing the response of APD without decreasing the quantum efficiency in the light-absorbing layer 405, but is also able to maintain the effectiveness of the distortion-compensated superlattice multiplication layer described in the first exemplary embodiment. Since both of these features can coexist together, as noted above, the APD having even faster response and higher sensitivity is obtained.

In the avalanche photodiode employing the superlattice structure as an avalanche multiplication layer, an introduction of the distortion-compensated superlattice structure for the superlattice layer makes it possible to reduce a layer thickness of the superlattice multiplication layer without decreasing the multiplication factor and increasing the dark current, as stated above. As a result, an operating voltage can be reduced, in addition to increasing the response. In addition, even further improvement of the high-speed response and high sensitivity is obtained by concurrently adopting the reflective multi-layer film structure.

What is claimed is:

1. An avalanche photodiode having an avalanche multiplication layer having a distortion-compensated superlattice structure.

2. The avalanche photodiode of claim 1, wherein said distortion-compensated superlattice structure comprises a barrier layer composed of $In_xAl_{1-x}As$, and a well layer composed of $In_yGa_{1-y}As_zP_{1-z}$, where x, y and z satisfy conditions of:

$0 \leq x < 0.52$;

$0.8 < y \leq 1$; and $0 \leq z < 0.6$.

3. The avalanche photodiode of claim 1 further comprising a multi-layered structure having a reflectivity of 60% or greater.

4. The avalanche photodiode of claim 2 further comprising a multi-layered structure having a reflectivity of 60% or greater.

5. An avalanche photodiode comprising:

a substrate layer;

a buffer layer adjacent to said substrate layer; and a distortion-compensated superlattice multiplication layer composed of $In_xAl_{1-x}As$ and $In_yGa_{1-y}As_zP_{1-z}$; over said buffer layer, wherein said distortion-compensated superlattice multiplication layer comprises a barrier layer composed of $In_xAl_{1-x}As$, and a well layer composed of $In_yGa_{1-y}As_zP_{1-z}$, where x, y and z satisfy conditions of:

$0 \leq x < 0.52$;

$0.8 < y \leq 1$; and $0 \leq z < 0.6$.

* * * * *

UNITED STATES PATENT AND TRADEMARK OFFICE
CERTIFICATE OF CORRECTION

PATENT NO. : 6,437,362 B2
DATED : August 20, 2002
INVENTOR(S) : Suzuki

It is certified that error appears in the above-identified patent and that said Letters Patent is hereby corrected as shown below:

Title page,
Item [56], References Cited, U.S. PATENT DOCUMENTS, insert
-- 6,229,152  5/2001  Dries et al. --.

Column 7,
Line 28, "comprosed" should read -- comprised --.

Signed and Sealed this

Fifteenth Day of April, 2003

JAMES E. ROGAN
*Director of the United States Patent and Trademark Office*